(12) United States Patent
Kawakami

(10) Patent No.: US 7,649,184 B2
(45) Date of Patent: Jan. 19, 2010

(54) PROCESSING METHOD AND SYSTEM

(75) Inventor: Eigo Kawakami, Tochigi (JP)

(73) Assignee: Canon Kabushiki Kaisha (JP)

( * ) Notice: Subject to any disclaimer, the term of this patent is extended or adjusted under 35 U.S.C. 154(b) by 632 days.

(21) Appl. No.: 10/794,500

(22) Filed: Mar. 5, 2004

(65) Prior Publication Data

US 2004/0222383 A1    Nov. 11, 2004

(30) Foreign Application Priority Data

Mar. 7, 2003    (JP)    ............... 2003-062338

(51) Int. Cl.
    *G01N 23/10*    (2006.01)
    *C23C 16/00*    (2006.01)
(52) U.S. Cl. .............. 250/430; 378/34; 118/719
(58) Field of Classification Search ............. None
    See application file for complete search history.

(56) References Cited

U.S. PATENT DOCUMENTS

| 5,205,051 A | 4/1993 | Hurwitt |
| 5,378,283 A | 1/1995 | Ushikawa |
| 2002/0002946 A1* | 1/2002 | Tanaka et al. ............... 118/719 |
| 2004/0083588 A1 | 5/2004 | Park |

FOREIGN PATENT DOCUMENTS

| EP | 1 282 157 | 2/2003 |
| JP | 2000-306838 | 11/2000 |
| JP | 2001-102281 | 4/2001 |
| KR | 10-0210623 | 7/1999 |

OTHER PUBLICATIONS

"Fundamentals of Vaccum Technology", Sep. 1998, Leybold Vacuum, p. 92.
European Search Report dated Jan. 9, 2006.
English Abstract of JP 2000-306838 published on Nov. 2, 2000.
English Translation of JP 2000-306838 published on Nov. 2, 2000.
Korean Office Action along with English translation.

* cited by examiner

*Primary Examiner*—Daborah Chacko Davis
(74) *Attorney, Agent, or Firm*—Rossi, Kimms & McDowell LLP

(57) ABSTRACT

A processing method uses a processing system which includes an atmosphere replacing chamber having first and second gate valves, and a container that has an inside maintained in a reduced pressure or vacuum atmosphere and provides a predetermined process to an object, wherein the atmosphere replacing chamber is connected to the container through the first gate valve and a space different from the container through the second gate valve. The processing method includes the steps of exhausting the atmosphere replacing chamber while introducing first gas below predetermined humidity to the atmosphere replacing chamber, and vacuum-pumping the atmosphere replacing chamber after said exhausting step, by reducing an amount of the first gas to be introduced into the atmosphere replacing chamber.

14 Claims, 7 Drawing Sheets

PROCESSING METHOD AND SYSTEM

This application claims the right of priority under 35 U.S.C. §119 based on Japanese Patent Application No. 2003-062338 filed on Mar. 7, 2003, which is hereby incorporated by reference herein in its entirety as if fully set forth herein.

BACKGROUND OF THE INVENTION

The present invention relates generally to a processing method for use with a semiconductor exposure apparatus and the like, and more particularly to environmental control over a load lock chamber that replaces an atmosphere between the air and a reduced pressure or vacuum atmosphere.

The developed exposure technology using synchrotron radiations has recently been sought for finer processing in the semiconductor fabrication, but the synchrotron radiation has a problem of X-ray attenuations in the air. Accordingly, a conventional processing system as one solution for this problem houses principal part of an exposure apparatus in a helium purged process chamber that reduces X-ray attenuations.

This processing system typically includes a load lock chamber that delivers a wafer between a port as a supply part and the process chamber, and exchanges its atmosphere between the air and the reduced pressure or vacuum atmosphere. The load lock chamber includes gate valves between the load lock chamber the port and between the load lock chamber and the process chamber. The gate value between the load lock chamber and the process chamber closes when the wafer is delivered between the port and the load lock chamber, and the load lock chamber is maintained at an the ambient pressure. The gate valve between the load lock chamber and the port closes when the wafer is delivered between the process chamber and the load lock chamber, and the load lock chamber is maintained at the reduced pressure or vacuum atmosphere.

Every wafer is subject to an atmosphere conversion from the air to helium in the load lock chamber, and then delivered to and exposed in the process chamber. It is returned to the load lock chamber after exposure, subject to an atmosphere conversion from helium to the air in the load lock chamber before taken out.

Before the atmosphere of the load lock chamber is replaced with helium, the load lock chamber should be vacuum-pumped once and then filled with helium at the same pressure as the process chamber to maintain the helium purity in the process chamber when the wafer is delivered to the process chamber. In returning the load lock chamber to the ambient pressure to take out the exposed water, the load lock chamber is vacuum-pumped and then filled with nitrogen or purifying air at the ambient pressure when helium is recovered, purified and recycled.

Thus, while the load lock chamber is being vacuum-pumped, an abrupt pressure drop results in adiabatic cooling, lowers the saturated moisture pressure, and forms dew when the load lock chamber is wet. For example, when the temperature of gas with the humidity of 50% drops down to about 12° C., the humidity becomes 100% and forms dew. There have been proposed some anti-condensation means for decontaminating a wafer, such as a method for slowing down the vacuum pumping speed, a method for introducing hot gas before vacuum pumping in order to compensate temperature that has dropped due to the adiabatic cooling (e.g. Japanese Patent publication No. 2000-40669), and a method for heating the inside of the load lock chamber.

However, a slow vacuum-pumping speed of the load lock chamber would disadvantageously lower the throughput in the exposure apparatus. An introduction of the hot gas and heating of the load lock chamber before vacuum pumping would transmit the undesirable heat to the temperature-controlled process chamber and harm its temperature stability, lowering the yield of the exposure apparatus.

BRIEF SUMMARY OF THE INVENTION

A processing method using a processing system which includes an atmosphere replacing chamber having first and second gate valves, and a container that has an inside maintained in a reduced pressure or vacuum atmosphere and provides a predetermined process to an object, wherein the atmosphere replacing chamber is connected to the container through the first gate valve and a space different from the container through the second gate valve, the processing method that includes the steps of exhausting the atmosphere replacing chamber while introducing first gas below predetermined humidity to the atmosphere replacing chamber, and vacuum-pumping the atmosphere replacing chamber after the exhausting step, by reducing an amount of the first gas to be introduced into the atmosphere replacing chamber.

The processing method may stop introducing the first gas in the vacuum pumping step. A processing method according to claim 1, wherein the container contains second gas, and wherein the processing method further comprises the steps of introducing the second gas that has been dried below the predetermined humidity to the atmosphere replacing chamber until the atmosphere replacing chamber has the same reduced pressure environment as the container, and opening the first gate valve.

A processing method may further include the steps of introducing third gas below the predetermined humidity to the atmosphere replacing chamber until the atmosphere replacing chamber has ambient pressure, and opening the second gate valve. The first gas may be nitrogen or purified air. The second gas may be inert gas. The third gas may be nitrogen or purified air. The predetermined process may be exposure. The first gas may be the same as the second gas. A processing method may further include the step of opening the first gate valve. A processing method may include the steps of judging whether humidity in the atmosphere replacing chamber is lower than preset humidity, and performing the vacuum-pumping step when the judging step determines that the humidity is lower than the preset humidity.

An exposure method of another aspect according to the present invention for exposing an object in a container by using light from a light source and a processing method that uses a processing system which includes an atmosphere replacing chamber having first and second gate valves, and the container that has an inside maintained in a reduced pressure or vacuum atmosphere, wherein the atmosphere replacing chamber is connected to the container through the first gate valve and a space different from the container through the second gate valve, and wherein the processing method includes the steps of exhausting the atmosphere replacing chamber while introducing first gas below predetermined humidity to the atmosphere replacing chamber, and vacuum-pumping the atmosphere replacing chamber after the exhausting step, by reducing an amount of the first gas to be introduced into the atmosphere replacing chamber. The processing method may be stop introducing the first gas in the vacuum pumping step.

A device fabricating method of another aspect according to the present invention includes the steps of exposing an object in a container by a processing method, and developing the exposed the object, wherein the processing method uses a processing system which includes an atmosphere replacing chamber having first and second gate valves, and the container that has an inside maintained in a reduced pressure or vacuum atmosphere, wherein the atmosphere replacing chamber is connected to the container through the first gate valve and a space different from the container through the second gate valve, and wherein the processing method includes the steps of exhausting the atmosphere replacing chamber while introducing first gas below predetermined humidity to the atmosphere replacing chamber, and vacuum-pumping the atmosphere replacing chamber after the exhausting step, by reducing an amount of the first gas to be introduced into the atmosphere replacing chamber. The processing method may stop introducing the first gas in the vacuum pumping step.

An exposure apparatus of another aspect according to the present invention for exposing an object in a container by using light from a light source and a processing method, wherein processing method uses a processing system which includes an atmosphere replacing chamber having first and second gate valves, and the container that has an inside maintained in a reduced pressure or vacuum atmosphere, wherein the atmosphere replacing chamber is connected to the container through the first gate valve and a space different from the container through the second gate valve, and wherein the processing method includes the steps of exhausting the atmosphere replacing chamber while introducing first gas below predetermined humidity to the atmosphere replacing chamber, and vacuum-pumping the atmosphere replacing chamber after the exhausting step, by reducing an amount of the first gas to be introduced into the atmosphere replacing chamber. The processing method may stop introducing the first gas in the vacuum pumping step.

A processing system of another aspect according to the present invention includes a container that has an inside maintained in a reduced pressure or vacuum atmosphere and provides a predetermined process to an object, an atmosphere replacing chamber that has first and second gate valves, the atmosphere replacing chamber is connected to the container through the first gate valve and a space different from the container through the second gate valve, a first gas supply mechanism for supplying first gas below predetermined humidity to the atmosphere replacing chamber, a pumping mechanism for exhausting the atmosphere replacing chamber, and a controller for judging whether the humidity in the atmosphere replacing chamber is lower than the present humidity when the pumping mechanism exhausts the atmosphere replacing chamber and the first gas supply mechanism supplies the first gas to the atmosphere replacing chamber, and for instructing the first gas supply mechanism to reduce the first gas supplied to the atmosphere replacing chamber by the first gas supply mechanism and the pumping mechanism to vacuum-pump the atmosphere replacing chamber when the humidity is lower than the preset humidity.

The controller may stop introducing the first gas when the humidity is lower than the preset humidity. The container may contain second gas, wherein the processing system further comprises a second gas supply mechanism for supplying the second gas that has been dried below predetermined humidity to the atmosphere replacing chamber, and wherein the controller instructs, before opening the first gate valve, the second gas supply mechanism to introduce the second gas below the predetermined humidity to the atmosphere replacing chamber until the atmosphere replacing chamber has the same reduced pressure environment as the container.

A processing system of another aspect according to the present invention includes a container that contains first gas, is maintained at a reduced pressure environment, and providing a predetermined process to an object, an atmosphere replacing chamber that includes first and second gate valves, is connected to the container through the first gate valve and the air through the second gate valve, and collects the object from the container, a first pumping mechanism for pumping an atmosphere in the atmosphere replacing chamber that has collected the object, a recycling mechanism for recycling the first gas that has been dried below predetermined humidity from the atmosphere pumped by the first pumping mechanism, a first gas supply mechanism for supplying the first gas recycled by the recycling mechanism, to the atmosphere replacing chamber, a second pumping mechanism for exhausting the atmosphere replacing chamber, and a controller for judging whether humidity in the atmosphere replacing chamber is lower than preset humidity when the second pumping mechanism exhausts the atmosphere replacing chamber and the first gas supplying mechanism supplies the first gas to the atmosphere replacing chamber, and for instructing the first gas supplying mechanism to reduced the first gas supplied to the atmosphere replacing chamber by the first gas supply mechanism and the pumping mechanism to vacuum-pump the atmosphere replacing chamber when the humidity is lower then the preset humidity.

The controller may stop introducing the first gas when the humidity is lower than the preset humidity. A processing system may further include a second gas supply mechanism for supplying second gas below the predetermined humidity to the atmosphere replacing chamber, wherein the controller instructs, before opening the second gate valve, the second gas supply mechanism to introduce the second gas below the predetermined humidity to the atmosphere replacing chamber until the atmosphere replacing chamber has ambient pressure.

DETAILED DESCRIPTION OF THE PREFERRED EMBODIMENTS

Figure 1:
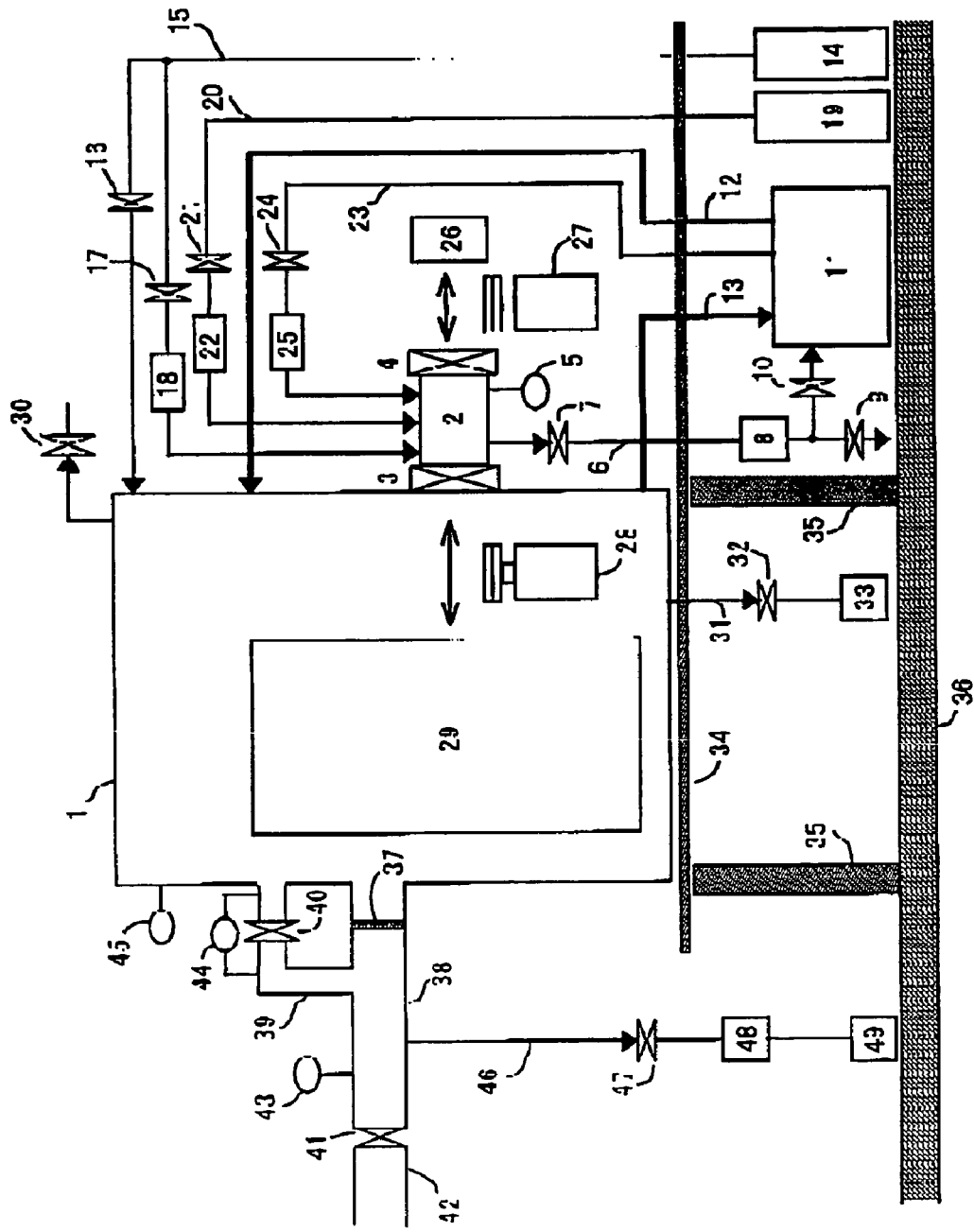
FIG. 1 is a schematic block diagram of a processing system of one embodiment according to the present invention.

With reference to accompanying drawings, a description will now be given of a processing system of one embodiment according to the present invention. Here, FIG. 1 is a schematic block diagram of one embodiment according to the present invention. While the processing system of this embodiment exposes a wafer as an object to be processed, the present invention does not limit a process of the processing system to the exposure, and is applicable to various processes such as deposition, etching and ashing. Of course, exposure requires high throughput and thus is suitable for the present invention.

With reference to FIG. 1, 1 is a process chamber that accommodates a wafer transport robot 28 and a principal part 29 of an exposure apparatus mounted with a stage, a shutter, etc. The exposure apparatus in the instant embodiment is an X-ray exposure apparatus that uses exposure light as synchrotron radiation light. Of course, the present invention does not limit a kind of exposure apparatus, as described later.

2 is a load lock chamber which includes an inner gate valve 3 connected to the process chamber 1, and an outer gate valve 4 connected to the air outside the chamber 1. The load lock chamber 2 receives a wafer that is to be processed from a wafer carrier 26, and supplies it to the process chamber 1. In addition, the load lock chamber 2 receives a processed wafer from the process chamber 1, and supplies it to the wafer carrier 26 or another apparatus (i.e. a posttreatment part).

The load lock chamber 2 and the transport robots 27 and 28 are configured to carry a wafer one by one, and the load lock camber 2 has a minimum capacity to minimize the exhaust time. In the present embodiment, a wafer has a diameter of 300 mm, the inner and outer gate valves 3 and 4 have an opening height of 50 mm, and the load lock chamber 2 has a capacity of 8 liters =400 mm×400 mm×50 mm.

5 is a pressure sensor for detecting a pressure in the load lock chamber 2. 6 is an exhaust line in the load lock chamber 2, which includes an exhaust valve 7, a vacuum pump 8, and an air valve 9.

11 is a helium circulation apparatus for circulating helium with constant pressure and purity in the process chamber 1 through a helium supply line 12 and a helium recovery line 13, and for maintaining the chamber 1's atmosphere suitable for X-ray exposure.

14 is a helium supply means for supplying helium with predetermined humidity (of, for example, 10%, preferably, 5%, here, the supplied helium's humidity should be at least lower than or similar to that demanded for the atmosphere in the process chamber). 15 is a helium supply line that includes a helium introducing valve 16 for the process chamber, a helium introducing valve 17 for the load lock chamber, and a helium flow controller 18. The helium supply line 15 may includes a dehumidifier system to assist helium in having the predetermined humidity.

19 is a nitrogen supply means for supplying nitrogen with predetermined humidity (of, for example, 10%, preferably, 5%, here, the supplied nitrogen's humidity should be at least lower than or similar to that demanded for the atmosphere in the process chamber). 20 is a nitrogen supply line which includes a nitrogen flow controller 22 and a nitrogen introducing valve 21. The nitrogen supply line 20 may include a dehumidifier system to assist nitrogen in having the predetermined humidity. 23 is a recycled helium supply line which includes a recycled helium flow controller 25 and a recycled helium introducing valve 24.

26 is a wafer carrier that is maintained at an ambient pressure and stores one or more wafers. 27 is a wafer transport robot for carrying a wafer between the wafer carrier 26 and the load lock chamber 2. 28 is wafer transport robot for carrying a wafer between the load lock chamber 2 and an exposure apparatus's principal part 29.

30 is an atmosphere releasing valve for opening the process chamber 1 to the air. 31 is a chamber exhaust line which includes an exhaust valve 32 and a vacuum pump 33. 35 is a support for supporting a clean room floor 34 on a factory floor 36.

37 is a beryllium window for transmitting synchrotron radiation light and for partitioning the process chamber 1 from a beam line 38 that becomes highly vacuum during exposure. 39 is a bypass line of the beryllium window 37 which includes a bypass valve 40. 41 a gate valve, connected to an upstream synchrotron, for disconnecting a beam line 42 that is always maintained highly vacuum and the beam line 38. 43 is a high vacuum gauge, 44 is a differential pressure sensor, and 45 is an absolute pressure sensor. 48 and 49 is vacuum pumps for drawing a vacuum in the beam line 38 through the exhaust valve 47 to maintain a high vacuum condition.

Figure 2:
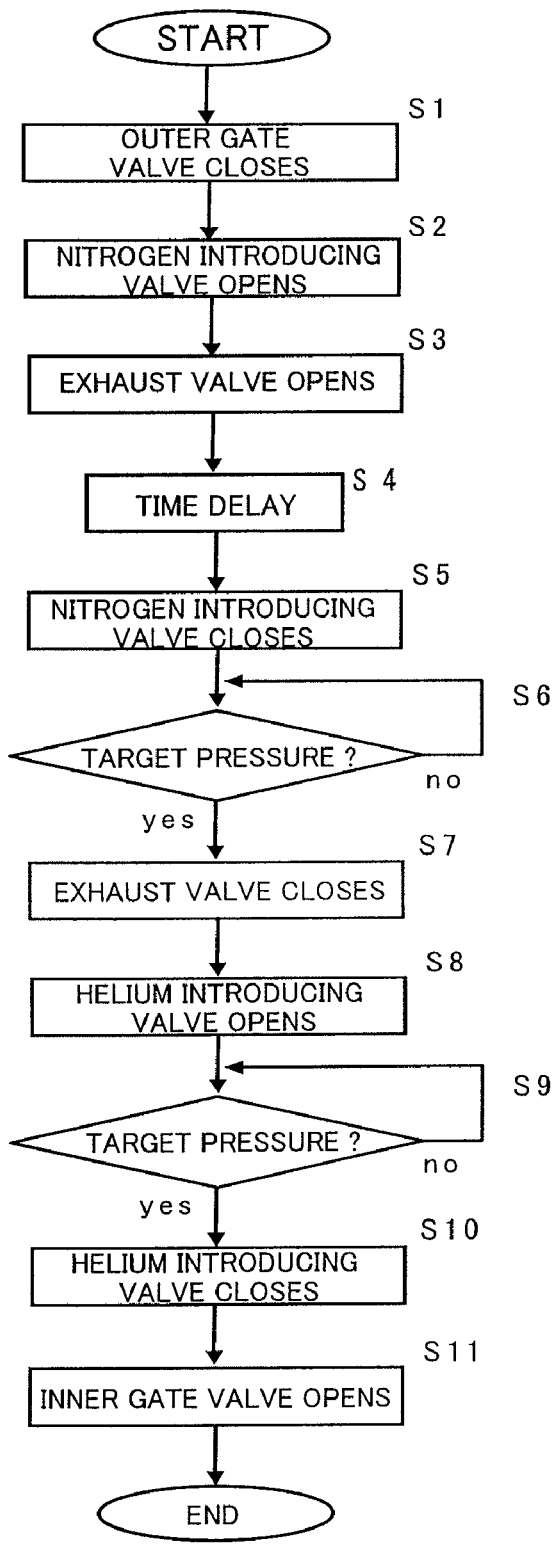
FIG. 2 is a flowchart for explaining a processing method for supplying a wafer from a load lock chamber to a process chamber in the processing system shown in FIG. 1.

FIG. 2 is a flowchart of a process used when the exposure apparatus replaces an atmosphere in the load lock chamber 2 connected to the air with helium. A controller (not shown) controls actions of each part in the apparatus in this process. More specifically, the controller controls opening/closing of the valves 3, 4, 7, 9, 10, 17, 21 and 24, and the transport actions of the robots 27 and 28 or switch of based on detection results by the pressure sensor 5, and time measured by a timer (not shown), etc.

When the process starts, the inner gate valve 3 closes, the outer gate valve 4 opens, and the load lock chamber 2 is connected to the air and maintained in the air atmosphere.

Initially, the wafer transport robot 27 carries a wafer from the wafer carrier 26 to the load lock chamber 2. The process shown in FIG. 2 then starts. The outer gate valve 4 closes (step S1).

Next, the nitrogen introducing valve 21 opens to start introducing nitrogen into the load lock chamber 2 (step S2). Nitrogen introduced from the nitrogen introducing valve 21 has been dried to the predetermined humidity (of, for example, 10%, preferably, 5%). Another embodiment introduces purified (or dry) air instead of nitrogen. While nitrogen and the air are less expensive than helium, which will be described later, the present invention does not limit a kind of gas to specific one. Thus, it is possible to introduce dry helium.

Next, the exhaust valve 7 opens before the pressure in the load lock chamber 2 exceeds the ambient pressure (step s3). Then, helium recovery valve 10 closed and the atmosphere exhaust valve 9 opens.

After a predetermined time elapses in this state (step s4), the nitrogen introducing valve 21 closes (step s5). Since the exhaust valve 7 remains open, the load lock chamber 2 is vacuum-pumped immediately. The controller (not shown) can obtain the predetermined time, for example, by using a gas analyzer to determine whether the humidity in the load lock chamber 2 becomes the predetermined humidity (of, for example, 10%) and averaging the time periods or by using a simulation result, In other words, the controller determines whether the humidity in the load lock chamber 2 is lower than predetermined in step s4 and, if determining it is, the procedure moves to step s5, if determining it is not, the procedure maintains steps s2 and s3. Step s5 subsequent to step s4 does not necessarily have to close the nitrogen introducing valve 21 (or zero an introduced amount of nitrogen through the nitrogen introducing valve 21), but may merely reduce an introduced amount of nitrogen from the nitrogen introducing valve 21 to the load lock chamber 2. However, it is preferable that the introduced amount of nitrogen is lower than the throughput of the exhaust valve 7. The introduced amount may be reduced stepwise, linearly or curvedly gradually (along a predetermined quadric, cubic or exponential function).

Next, the controller determines whether an output from the pressure sensor 5 is below a predetermined value indicative of the target pressure (step s6). When determining it is, the controller closes the exhaust valve 7 (step s7). For example, when the load lock chamber 2 has a capacity of 8 liters and takes 20 seconds as exhaust time to reach 100 Pa, an air temperature drops down to about −25° C. The instant embodiment has previously maintained the humidity in the load lock chamber 2 to be 10% with nitrogen at 23° C. Therefore, steams do not form dew even when the temperature drops down to −25° C., because a saturation value falls below 1. Thus, a conventional problem does not occur, such as condensation moisture gathering neighboring fine particles, growing, and finally dropping as deposits on a wafer.

Next, the helium introducing valve 17 opens (step s8). Helium introduces from the helium introducing valve 17 has been dried to the predetermined humidity (of, for example, 10%). Supplied gas is used to the process chamber 1. Thus, if the chamber 1 needs another inert gas such as argon and xenon, that gas would be introduced by step s8.

Next, the controller checks an output of the pressure sensor 5 and introduces helium to the load lock chamber 2 up to the pressure of the process chamber 1. The helium introducing valve 17 closes when pressure of the load lock chamber 2 increases to that of the process chamber 1 (step s10). Finally, the inner gate valve 3 opens and the load lock chamber 2 is connected to the process chamber 1 (step s11). After the series of processes, the wafer transport robot 28 carries a wafer from the load lock chamber 2 to the exposure apparatus' principal part 29.

The principal part 29 exposes the wafer. If the conventional processing method attempts to maintain the same throughput and yield as the present invention, condensation moisture that occurs in drawing a vacuum would gather particles, grow, and finally drop as impurities on a wafer, making high-quality exposure difficult. On the other hand, as discussed, the instant embodiment eliminates impurities from a wafer and provides high-quality exposure to a wafer.

In replacing an atmosphere in the load lock chamber 2, the atmosphere replacing method according this embodiment introduces nitrogen and purified or dry air that are less expensive than helium while exhausting the load lock chamber 2, draws a vacuum after replacing the inside of the load lock chamber 2 with dry gas, and then introduces helium up to the predetermined pressure. This can prevent condensations that would otherwise disadvantageously occur in the prior art in drawing a vacuum, and avoid contaminations to the inside of the load lock chamber and a wafer. Since the exhaust speed does not go down, an exposure apparatus maintains the throughput without requiring a heat source like a heater and its additive. Therefore, the temperature stability, which would be otherwise deteriorated by these temperature variance factors, is maintained without increasing the cost and space of the processing system.

Figure 3:
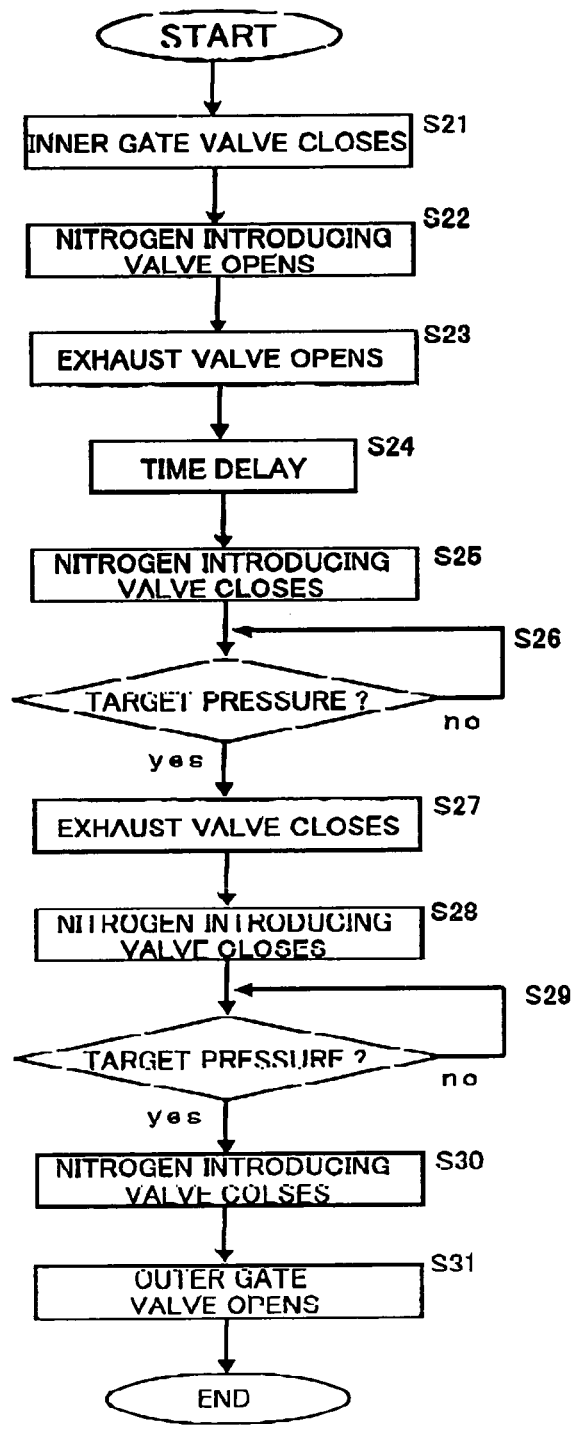
FIG. 3 is a flowchart for explaining a processing method for supplying the wafer from the process chamber to the load lock chamber in the processing system shown in FIG. 1.

FIG. 3 is a flowchart of a process used to replace an atmosphere in the load lock chamber 2 with the air, which is connected to the chamber 1 having a helium atmosphere. After exposure, the wafer transport robot 28 carries an exposed wafer from the principal part 29 in the exposure apparatus to the load lock chamber 2. The process shown in FIG. 3 starts with following steps. The inner gate valve 3 initially closes (step s21). The nitrogen introducing valve 21 then opens, starting an introduction of nitrogen into the load lock chamber 2 (step s22). The exhaust valve 7 opens before the pressure in the load lock chamber 2 exceeds the pressure in the process chamber 1 for reduced replacement time (step s23). Then, the helium recovery valve 10 remains closed and an air exhaust valve 9 remains open (step s23).

After the predetermined time elapses in this state (step s24), the nitrogen introducing valve 21 closes (step s25). Since exhaust valve 7 remains open, the load lock chamber 2 is vacuum-pumped. The controller (not shown) can obtain the predetermined time, for example, by using a gas analyzer to determine whether the humidity in the load lock chamber 2 becomes the predetermined humidity (of, for example, 10%) and averaging the time periods or by using a simulation result. In other words, the controller determines whether the humidity in the load lock chamber 2 is lower than predetermined in step s24 and, if determining it is, the procedure moves to step s25, if determining it is not, the procedure maintains steps s22 and s23.

Next, the controller determines whether an output from the pressure sensor 5 is below a predetermined value indicative of the target pressure (step s26). When determining it is, the controller closes the exhaust valve 7 (step s27). Since humidity in the load lock chamber 2 is below the predetermined value, even rapid vacuum-pumping does not cause condensations.

Next, the controller opens the nitrogen introducing valve 21 again (step s28), and introduces nitrogen up to the ambient pressure while checking an output of the pressure sensor 5 (step s29). The nitrogen introducing valve 21 closes (step s30) when the pressure of the load lock chamber 2 reaches the ambient pressure. Another embodiment introduces purified (or dry) air instead of nitrogen. Finally, the outer gate valve 4 opens (step s31) to connect the load lock chamber 2 to the air. When the series of processes end, the wafer transport robot 27 carries the wafer from the load lock chamber 2 to the wafer carrier 26.

The method may immediately collect an atmosphere in the load lock chamber 2 before the load lock chamber 2 is opened to the air although an atmosphere in the process chamber 1 flows into the load lock chamber 2 when the wafer is collected from the process chamber 1. As a result, it is possible to prevent deteriorated throughput or yield in the processing system. Moreover, it is possible to prevent the exposed wafer from contaminated with condensations.

Figure 4:
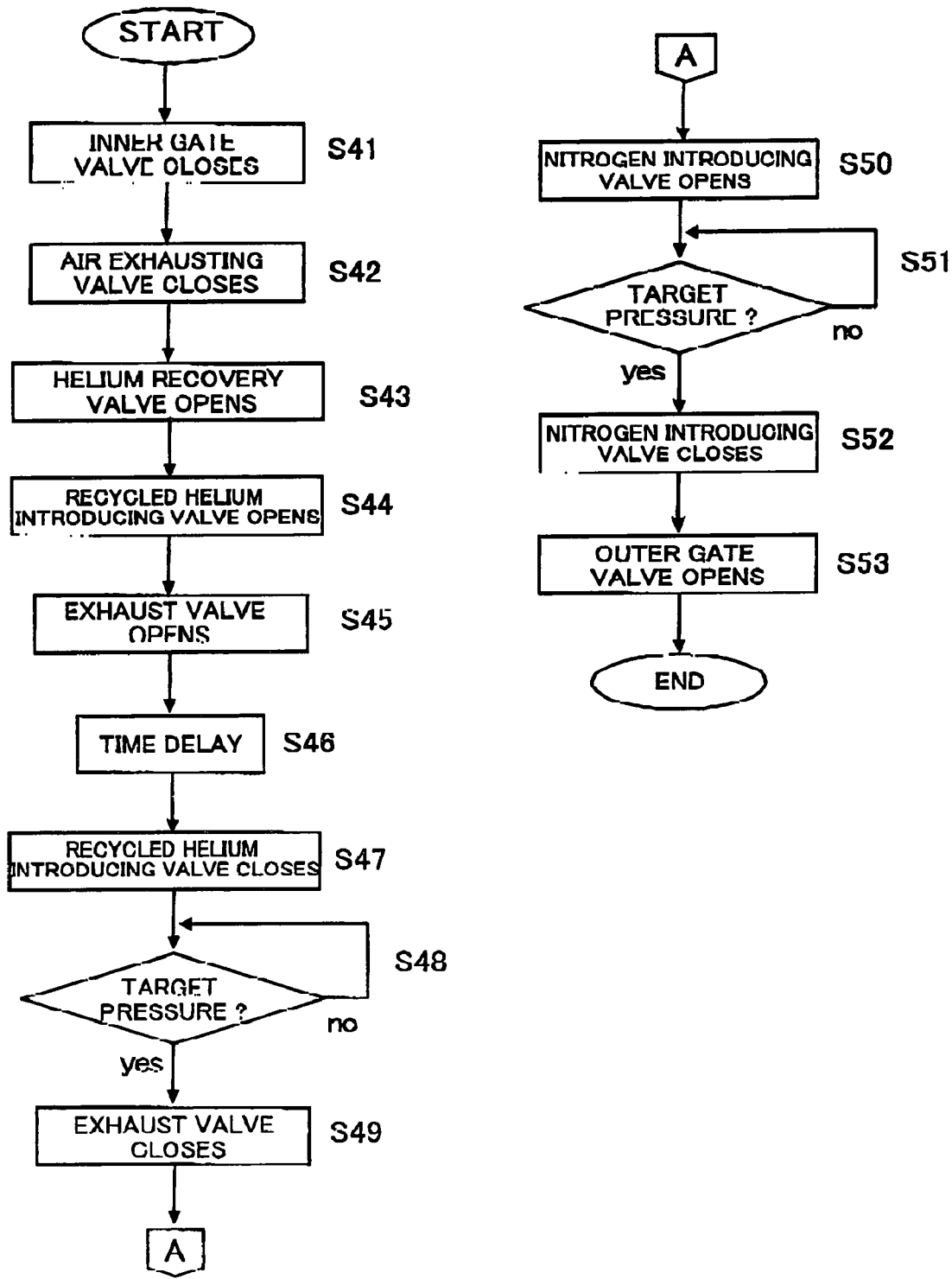
FIG. 4 is a flowchart as a variation of FIG. 3.

FIG. 4 is a flowchart of another process used to replace an atmosphere in the load lock chamber 2 with the air, which is connected to the chamber 1 having a helium atmosphere. This embodiment is directed to a process for recycling expensive helium.

When the process shown in FIG. 4 starts, the inner gate valve 3 closes first (step s41). Next, the air exhausting valve 9 closes (step s42), and the helium recovery valve 10 opens (step s43). If the exhaust valve 7 opens, helium in the load lock chamber 2 is collected into the helium circulation apparatus 11, purified, compressed, and stored in a buffer tank (not shown) of the helium circulation apparatus 11.

Next, a recycled helium introducing valve 24 opens (step s44), and the helium circulation apparatus 11 starts introducing purified helium. Similar to FIG. 3, exhaust valve 7 opens (step s45) before the pressure in the load lock chamber 2 exceeds that in the process chamber 1 for shortened replacement time. Thus, as described above, the helium circulation apparatus 11 collects helium in the load lock chamber 2, and then supplies recycled helium in the load lock chamber 2 for replacement.

After the predetermined time elapses (step s46), the recycled helium introducing valve 24 closes (step s47). Since the exhaust valve 7 and the helium recovery valve 10 remain open, the load lock chamber 2 is vacuum-pumped. The controller (not shown) can obtain the predetermined time, for example, by using a gas analyzer to determine whether the humidity in the load lock chamber 2 becomes the predetermined humidity (of, for example, 10%) and averaging the time periods or by using a simulation result. In other words, the controller determines whether the humidity in the load lock chamber 2 is lower than predetermined in step s46 and, if determining it is, the procedure moves to step s5, if determining it is not, the procedure maintains steps s44 and s45.

Next, the controller determines whether an output from the pressure sensor 5 is below a predetermined value indicative of the target pressure (step s48). When determining it is, the controller closes the exhaust valve 7 (step s49). Since humidity in the load lock chamber 2 is below the predetermined value, even rapid vacuum-pumping does not cause condensations.

Next, the controller opens the nitrogen introducing valve 21 (step s50), and introduces nitrogen up to the ambient pressure while checking an output of the pressure sensor 5 (step s51). The nitrogen introducing valve 21 closes (step s52) when the pressure of the load lock chamber 2 reaches the ambient pressure. Another embodiment introduces purified (or dry) air instead of nitrogen. Finally, the outer gate valve 4 opens (step s53) to connect the load lock chamber 2 to the air. When the series of processes end, the wafer transport robot 27 carries the wafer from the load lock chamber 2 to the wafer carrier 26.

The method can immediately collect an atmosphere in the load lock chamber 2 before the load lock chamber 2 is opened to the air although an atmosphere in the process chamber 1 flows into the load lock chamber 2 when the wafer is collected from the process chamber 1. As a result, it is possible to prevent deteriorated throughput or yield in the processing system. Moreover, it is possible to prevent the exposed wafer from contaminated with condensations.

A water processing apparatus that has a decompression container in a vacuum state opens an inner valve when drawing a vacuum in the load lock chamber ends, and connects the decompression container to the load lock chamber for similar effects.

Figure 5:
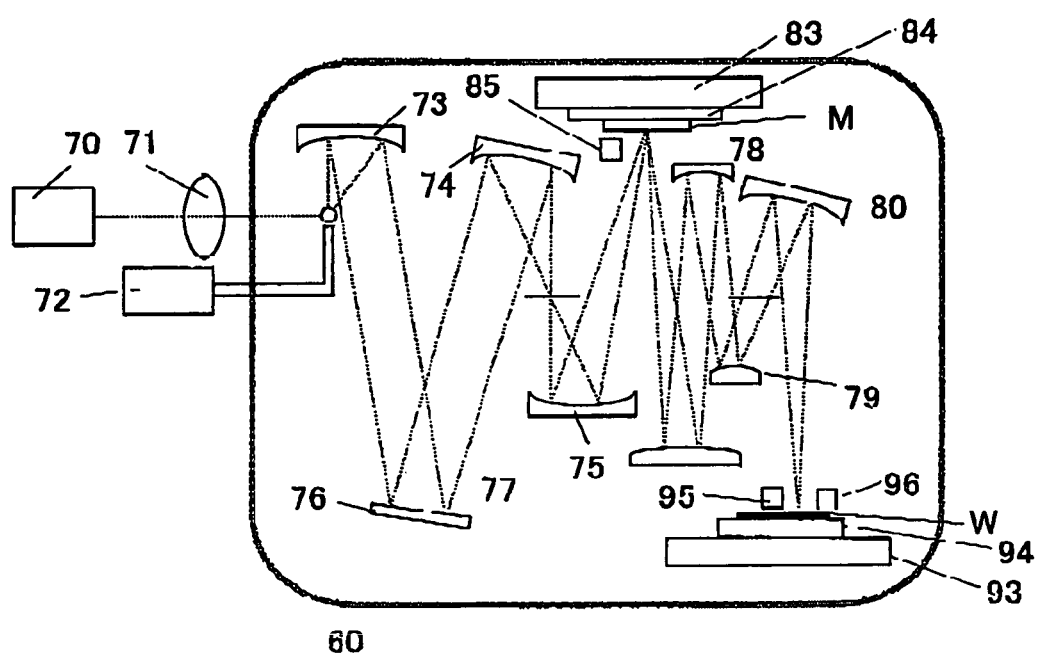
FIG. 5 is an EUV optical system as a variation of the exposure apparatus shown in FIG. 1.

Different from the above embodiment, the exposure apparatus' the principal part 29 may be an extreme ultraviolet ("EUV") optical system as shown in FIG. 5. The present invention is suitable because the EUV optical system is maintained in a vacuum container to prevent the EUV light from being disadvantageously absorbed by being oxygen or other gases and the throughput from deteriorating.

In FIG. 5, an EUV light source is, for example, a laser plasma light source which includes an excited pulsed laser 70, a condenser lens 71, and a target supply apparatus 72. An illumination optical system includes plural multilayer coatings or oblique incidence mirrors 73 to 75, an optical integrater 76, etc.

The projection optical system uses plural mirrors 77 to 80. The necessary number of mirrors is about 4 to 6 for aberrational corrections. The mirror has a convex and concave spherical or aspheric reflective surface shape. The mirror is made by grinding and polishing a substrate made of a rigid and hard material with a small coefficient of thermal expansion, such as SiC and low expansion coefficient glass, into a predetermined reflective surface shape, and then forming a multilayer coating, such as molybdenum/silicon onto the reflective surface.

A reticle stage 83 and a wafer stage 93 have mechanisms for synchronously scanning at a speed ratio in proportion to the reduction ratio. Here, it is assumed that X is a scan direction in the reticle M or wafer W surface, Y is a direction perpendicular to it, and Z is a direction perpendicular to the reticle M or the wafer W surface.

The reticle M is held by a reticle chuck 84 on the reticle stage 83. The reticle stage 83 has a mechanism that moves in the direction X at a high speed. It also has a fine adjustment mechanism for positioning the reticle M in and around each of the directions X, Y and Z. A position and orientation of the reticle stage 83 are measured by a laser interferometer, and controlled based on the result. The reticle M is a reflection mask and includes the same multilayer coating as that of a mirror.

The wafer W is held on the wafer stage 93 by a wafer chuck 94. Like the reticle stage 83, the wafer stage 93 has a mechanism that moves in the direction X at a high speed. It also has a fine adjustment mechanism for positioning the wafer W in and around each of the directions X, Y and Z. The position and orientation of the wafer stage 93 are measured by a laser interferometer, and controlled based on the result.

Alignment detection optical systems 85 and 95 are arranged in front of the reticle M and wafer W. Tho alignment detection optical systems 85 and 95 provide a positional relationship between a position of the reticle M and an optical axis of the projection optical system 77 to 80, and a positional relationship between a position of the water W and the optical axis of the projection optical system 77 to 80. The positions and angles of the reticle stage 83 and the wafer stage 93 are set so that a projected image of the reticle M may accord with a predetermined position on the wafer W.

A focus detection optical system 96 is also provided in front of the wafer W, and measures a focus position on the wafer W plane in the direction Z. The wafer plane is always maintained at an imaging position for the projection optical system 77 to 80 during exposure by controlling a position and an angle of the wafer stage 93.

When one scan exposure ends on the wafer W, the wafer stage 93 moves stepwise in the directions X and Y to a scan exposure start position of a next short, and the reticle stage 83 and wafer stage 93 synchronously scan in the direction X at a speed ratio in proportion to the reduction ratio of the projection optical system 77 to 80. In this way, the scan exposure repeats while a reduced size of projected image of the reticle M is formed on the wafer W (in the step-and-scan manner). Thus, a pattern on the reticle M is transferred onto the whole area of the wafer W.

A vacuum chamber 60 houses the illumination optical system 73 to 76, the projection optical system 77 to 80, the reticle M, and the wafer W. The invention processing method is applicable to feeding of a wafer W in the vacuum chamber 60 and feeding the wafer W out of the vacuum chamber 60. As a result, high-quality exposure is performed for the wafer W.

Thus, the above embodiments according to the present invention exhausts the load lock chamber while introducing purified air or nitrogen before vacuum-pumping the load lock chamber to replace its atmosphere, and vacuum-pumps the load lock chamber after replacing the atmosphere with dry gas. This can prevent condensations that would otherwise disadvantageously occur in drawing a vacuum, and avoid contaminations to the inside of the load lock chamber and a wafer. Since the exhaust speed does not down, an exposure apparatus maintains the throughput. Since the exposure apparatus does not require a heat source like a heater and its additive, the temperature stability is maintained without increasing the cost and space of the processing system.

Further, the present invention is not limited to these preferred embodiments, and various variations and modifications may be made without departing from the scope of the present invention. For example, the processing system may include a load lock chamber for supplying a wafer to the process chamber, and another load lock chamber for receiving the processed wafer from the process chamber. In this case, different load lock chamber conduct an exhaust process for supplying a wafer to the process chamber, and an exhaust process for transferring the collected wafer from the process chamber. Inert gas, supplied to the load lock chamber may not be helium and/or nitrogen but may be argon and the like.

Figure 6:
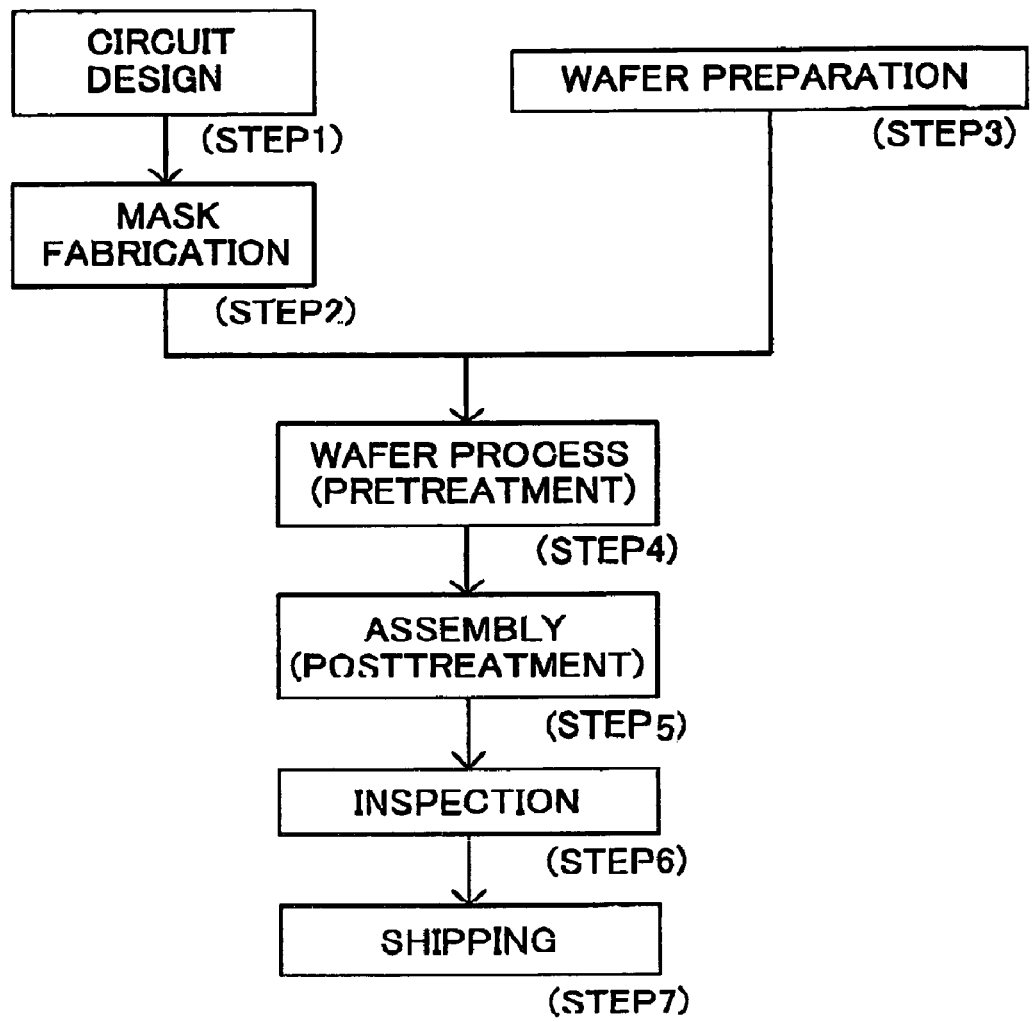
FIG. 6 is a flowchart for explaining a fabrication of devices (i.e., semiconductor chips such as IC and LSI, LCDs CCDs, etc.).
Figure 7:
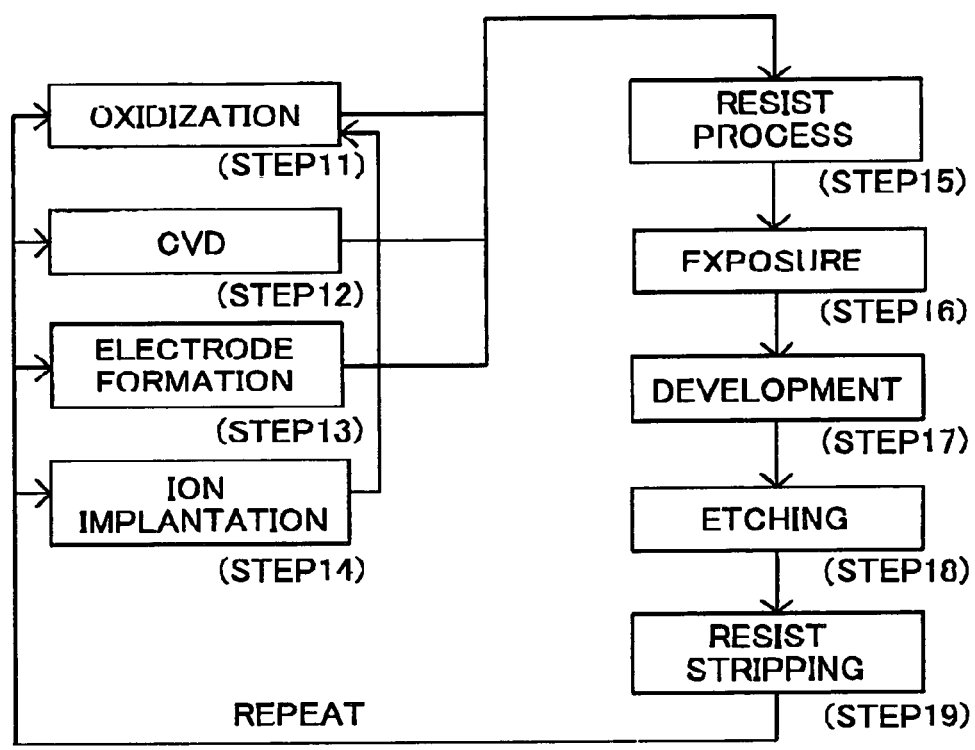
FIG. 7 is a detail flowchart for explaining the step 4 shown in FIG. 6.

Referring now to FIGS. 6 and 7, a description will be given of an embodiment of a device fabricating method using the above inventive method. FIG. 6 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon Stop 4 (wafer process), which is referred to as a pretreatment, forms actual circuitry on the wafer through photolithography using the mask and water. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional method.

Thus, the present invention can provide a processing method and system, which prevent condensations and provide high-quality processes without lowering the predetermined yield and throughput.

What is claimed is:

1. A processing method using a processing system which includes an atmosphere replacing chamber having first and second gate valves, and a container that has an inside maintained in a reduced pressure or vacuum atmosphere and provides a predetermined process to an object, wherein the atmosphere replacing chamber is connected to the container through the first gate valve and a space different from the container through the second gate valve, said processing method comprising the steps of:
   closing the first and second gate valves;
   exhausting the atmosphere replacing chamber while introducing first gas having humidity lower than 10%, with the first and second gate valves closed;
   judging whether humidity in the atmosphere replacing chamber is lower than 10% after said exhausting step; and
   vacuum-pumping the atmosphere replacing chamber, by stopping introducing the first gas when said judging step determines that the humidity is lower than 10%.

2. A processing method according to claim 1, wherein said container contains second gas, and wherein said processing method further comprises the steps of:
   introducing the second gas that has been dried below a predetermined humidity to the atmosphere replacing chamber until the atmosphere replacing chamber has the same reduced pressure environment as the container; and
   opening the first gate valve.

3. A processing method according to claim 2, wherein the second gas is inert gas.

4. A processing method according to claim 2, wherein the first gas is the same as the second gas.

5. A processing method according to claim 1, further comprising the steps of:
   introducing third gas below a predetermined humidity to the atmosphere replacing chamber until the atmosphere replacing chamber has ambient pressure; and
   opening the second gate valve.

6. A processing method according to claim 5, wherein the third gas is nitrogen or purified air.

7. A processing method according to claim 1, wherein the first gas is nitrogen or purified air.

8. A processing method according to claim 1, wherein the predetermined process is exposure.

9. A processing method according to claim 1, further comprising the step of opening the first gate valve.

10. A processing method according to claim 1, wherein said exhausting step exhausts the atmosphere replacing chamber while introducing first gas having humidity lower than 5%,
    wherein said judging step judges whether humidity in the atmosphere replacing chamber is lower than 10% and
    wherein said vacuum-pumping step vacuum-pumps the atmosphere replacing chamber, by stopping introducing the first gas when said judging step determines that the humidity is lower than 10%.

11. An exposure method for exposing an object in a container by using light from a light source and a processing method that uses a processing system which includes an atmosphere replacing chamber having first and second gate valves, and the container that has an inside maintained in a reduced pressure or vacuum atmosphere, wherein the atmosphere replacing chamber is connected to the container through the first gate valve and a space different from the container through the second gate valve, and
    wherein the processing method includes the steps of:
    closing the first and second gate valves;
    exhausting the atmosphere replacing chamber while introducing first gas having humidity lower than 10%, with the first and second gate valves closed;
    judging whether humidity in the atmosphere replacing chamber is lower than 10% after said exhausting step; and
    vacuum-pumping the atmosphere replacing chamber, by reducing an amount of the first gas to be introduced into the atmosphere replacing chamber when said judging step determines that the humidity is lower than 10%.

12. An exposure method according to claim 11, wherein the processing method stops introducing the first gas in the vacuum pumping step.

13. A processing method using a processing system which includes an atmosphere replacing chamber having first and second gate valves, and a container that has an inside maintained in a reduced pressure or vacuum atmosphere and provides a predetermined process to an object, wherein the atmosphere replacing chamber is connected to the container through the first gate valve and a space different from the container through the second gate valve, said processing method comprising the steps of:
    closing the first and second gate valves;

introducing a first gas to the atmosphere replacing chamber with the first and second gate valves closed without pumping the atmosphere replacing chamber where the first gas having a humidity of equal to or less than 10%;

a first pumping of the atmosphere replacing chamber while introducing the first gas to the atmosphere replacing chamber; and a second pumping of the atmosphere replacing chamber after said first pumping step by stopping introducing the first gas to the atmosphere replacing chamber.

14. An exposure method for exposing an object in a container by using light from a light source and a processing method that uses a processing system which includes an atmosphere replacing chamber having first and second gate valves, and the container that has an inside maintained in a reduced pressure or vacuum atmosphere, wherein the atmosphere replacing chamber is connected to the container through the first gate valve and a space different from the container through the second gate valve, and wherein the processing method includes the steps of:

closing the first and second gate valves;

introducing a first gas to the atmosphere replacing chamber without pumping the atmosphere replacing chamber where the first gas having a humidity of equal to or less than 10%:

a first pumping of the atmosphere replacing chamber while introducing the first gas to the atmosphere replacing chamber; and a second pumping of the atmosphere replacing chamber after said first pumping step by reducing an amount of the first gas to be introduced into the atmosphere replacing chamber.

* * * * *